United States Patent [19]

Ido et al.

[11] Patent Number: 5,235,422

[45] Date of Patent: Aug. 10, 1993

[54] FREQUENCY STABILIZED CLOCK SIGNAL GENERATOR SYNCHRONIZED TO AN INPUT VIDEO SIGNAL

[75] Inventors: Kazuo Ido; Takashi Takayama; Yoshiyuki Suzuki, all of Kanagawa, Japan

[73] Assignee: Sony Corporation, Tokyo, Japan

[21] Appl. No.: 864,650

[22] Filed: Apr. 7, 1992

[30] Foreign Application Priority Data

Apr. 11, 1991 [JP] Japan .................. 3-163298

[51] Int. Cl.$^5$ .................. H04N 5/04; H04N 5/06; H04N 5/95

[52] U.S. Cl. .................. 358/158; 358/159; 358/337; 360/36.1

[58] Field of Search .......... 358/158, 159, 149, 150, 358/337, 338, 339; 331/20; 360/77.13, 77.16, 77.12, 36.1, 36.2

[56] References Cited

U.S. PATENT DOCUMENTS 4,745,494 5/1988 Kaneko et al. .................. 358/338
5,039,955 8/1991 Motté .................. 331/20 X
5,121,206 6/1992 Shibayama et al. .................. 358/150

FOREIGN PATENT DOCUMENTS 01-115275 5/1989 Japan .

Primary Examiner—James J. Groody
Assistant Examiner—Safet Metjahic
Attorney, Agent, or Firm—William S. Frommer; Alvin Sinderbrand

[57] ABSTRACT

A synchronizing clock generating circuit for generating synchronizing clocks timed to synchronizing signals contained in input video signals is disclosed. A trapezoidal wave from a trapezoidal wave generator 19 and a reference pulse RP from a reference pulse generator 12 are compared as to phase in a phase comparator 21, while the trapezoidal wave and a pseudo-reference pulse rp from a CH2 generator 23 are compared as to phase in a phase comparator 22, and a difference between outputs of phase comparison is used in a dc detection circuit 24 for controlling the gradient of the trapezoidal wave. Besides, an output of a VCO 15, controlled by the results of phase comparison between the trapezoidal wave and the reference pulse RP is used as a synchronizing clock signal. In this manner, the synchronizing clock signal is stabilized in frequency, while frequency deviations produced by temporal changes in component parts or temperature characteristics may be corrected to prevent deteriorations, such as bends or distortions, from being produced in the reproduced picture, for improving the picture quality.

4 Claims, 5 Drawing Sheets

FREQUENCY STABILIZED CLOCK SIGNAL GENERATOR SYNCHRONIZED TO AN INPUT VIDEO SIGNAL

BACKGROUND OF THE INVENTION

1. Field of the Invention

This invention relates to a synchronizing clock generating circuit for generating clock signals synchronized with e.g. synchronizing signals for video signals.

2. Description of the Prior Art

Among synchronizing clock generating circuits for generating clocks timed to synchronizing signals of video signals, that is synchronizing clock signals, there is, for example, a clock generating circuit for clock signals for writing in a memory arranged in a time base corrector (TBC) which is adapted for correcting the time base for video signals (synchronizing clock signals). This synchronizing clock generating circuit is arranged as shown for example in FIG. 1.

In this figure, playback video signals from e.g. a video tape recorder (VTR) are supplied to an input terminal 10 and thence supplied to a synchronizing signal separating circuit 11, where horizontal synchronization signals SH are separated from playback video signals also containing vertical synchronization signals. The separated horizontal synchronization signals SH are supplied to a reference pulse generating circuit 12, where reference pulses RP are generated on the basis of the horizontal synchronization signals and transmitted to a phase comparator 53 which will be described subsequently.

The reference pulses RP from the reference pulse generator 12 are also supplied to a voltage-controlled oscillator (VCO) 15. Write clock signals WCK to be transmitted to the above-mentioned TBC memory, that is, synchronizing clock signals, are generated by VCO 15 so as to be supplied via a terminal 17 to the TBC. The VCO 15 is controlled on the basis of the results of phase comparison of the synchronizing clock signals and the reference pulses RP generated from the horizontal synchronization signals contained in the video signals. That is, the results of phase comparison are fed back to the VCO 15 via a lowpass filter (LPF) 14 by a phase locked loop (PLL) for phase matching the synchronizing clock signals to the reference pulses RP derived from the horizontal synchronization signals contained in the video signals.

To this end, the above-mentioned synchronizing clock signals, outputted from VCO 15, are supplied to a PLL counter 16 which counts the number of clocks of the synchronizing clock signals to transmit the results to a count H generator 58. This count H generator generates a trigger pulse CH having a frequency equal to a submultiple N of the frequency of the write clocks (synchronizing clock signal) WCK, where N may be 858 or 910 etc.

This trigger pulse CH is sent to a trapezoidal wave generator 59, where a trapezoidal wave is generated from the falling edge of the trigger pulse CH. The trapezoidal wave is transmitted to a phase comparator 53. It is this phase comparator that is used for effecting phase comparison between the above-mentioned reference pulse RP and the synchronizing clock signals. In the phase comparator 53, the above-mentioned synchronizing clock signal and the reference pulse RP are phase-compared to each other with the aid of the trapezoidal wave.

Specifically, the trapezoidal wave is sampled in the phase comparator 53 with teh reference pulses RP. An output of the phase comparator 53 is fed back as error signals to VCO 15 via the above-mentioned lowpass filter 14 for controlling the VCO 15.

The above-mentioned error signals from the phase comparator 53 are transmitted to the lowpass filter 14 via a sample-and-hold circuit 56.

Meanwhile, the falling edge position of the above-mentioned trigger pulse CH from the count H generator 58 is produced at a position N−n ahead of N in terms of a decoding value of the PLL counter 16, where N is a number, such as 910, corresponding to the number of clock pulses in one horizontal line (1H) of a video signal and n may for example be 14. Thus the trigger pulse CH falls at a position N−n or 910−14=896 ahead of N=910. Thus the trapezoidal wave generator 59 generates the trapezoidal wave sloped down from this falling position of the trigger pulse CH. At a timing of the next 1H, corresponding to n counts, herein 14 counts, from this falling position of the trigger pulse CH, a reference pulse RP is generated by the reference pulse generator 12 for phase comparison in the phase comparator 53.

If the next reference pulse RP is delayed, it samples the latter half of the trapezoidal wave, whereas, if the next reference pulse RP arrives at a premature time, it samples the former half of the trapezoidal wave. In both of these cases, error signals are supplied via sample-and-hold circuit 16 and LPF 14 to VCO 15 so that the clock WCK generated by VCO 15 are synchronized with the reference pulse RP.

However, it may occur that the gradient of the descending slope of the trapezoidal wave from the trapezoidal wave generator 59 be changed with lapse of time or due to fluctuations from circuit to circuit or fluctuations in temperature characteristics. What happens in such case is explained by referring to FIG. 2.

It is supposed that the gradient b of the trapezoidal wave is normal during reproduction at a normal tape speed. The falling of the trigger pulse CH occurs n clocks ahead of N clocks corresponding to 1H. A sampling value of the gradient b by a reference pulse RPb coming after lapse of a time t corresponding to the n clocks since the falling of the trigger pulse CH is a reference level and, if the sampling value of the gradient b is not equal to this reference level, error signals are produced by the phase comparator 53 for controlling the VCO 15.

If the gradient of the trapezoidal wave is changed by some reason and become a gradient a, the VCO 15 is locked so that the reference pulse RP is at a reference level a' having a gradient a, so that the relation of the trapezoidal wave with the reference pulse RP is as shown at RPa. Although the positions of the RP pulses are shown to be deviated in FIG. 2, the RP pulses are generated at an interval equal to that of the synchronizing pulses which is basically constant, so that, if the gradient of the trapezoidal wave becomes acute, as at a, the VCO 15 is controlled in such a manner that the falling position of the trigger pulse CH is delayed. Since the number of count clocks up to the trigger pulse CH is constant at N−n which is equal to e.g. 896, the VCO 15 has to cope with the situation by lowering the clock frequency for delaying the falling position of the trigger pulse CH. In such case, the write clocks WCK are lowered in frequency so that the TBC supplied with these WCK pulses cannot be operated normally.

If the gradient of the trapezoidal wave becomes milder as at c, the VCO 15 controls clocks so that the reference pulse RP is at a reference level c' having a gradient c. In such case, the VCO 15 has to cope with the situation by raising the clock frequency for advancing the falling position of the trigger pulse CH, so that again the TBC is unable to be operated normally.

It is noted that the length of the 1H period of the playback video signals is changed with the reproducing speed and hence the correct gradient of the trapezoidal wave is similarly changed depending on the reproducing state or with the reproducing speed. Heretofore, changes in the gradient were controlled in an open loop on the basis of the reproducing speed supplied from terminal 60.

In this case, however, the above-mentioned frequency deviations are unavoidably produced due to, for example, temperature characteristics or deterioration of various components with lapse of time, such that degradations such as bends or distortions in the reproduced images are produced by these frequency deviations, thereby lowering the picture quality.

Meanwhile, if the reference pulses should fail to be produced by signal dropout, the VCO 15 or the PLL counter 16 is not reset, so that the frequency deviations are directly manifested as bends in the reproduced image.

OBJECT AND SUMMARY OF THE INVENTION

In view of the above described status of the art, it is an object of the present invention to provide a synchronizing clock generating circuit which is capable of correcting the frequency deviations brought about not only by changes in the reproducing speed but also by changes in the properties of the components with lapse of time or temperature characteristics, and which is not susceptible to deterioration in the reproduced image due to, for example, bends or distortions, for improving the picture quality.

The present invention provide a synchronizing clock generator for generating synchronizing clock signals timed to synchronizing signals contained in input video signals, comprising reference pulse generating means for generating reference pulses conforming to the synchronizing signals contained in the input video signals, clock pulse generating means for generating clock pulses, counting means for counting said clock pulses based on said reference pulses, pseudo-reference pulse generating means for generating pseudo-reference pulses based on a count output of said counting means, trigger pulse generating means for generating pseudo-reference pulses conforming to the count output of said counting means, trapezoidal wave generating means for generating a trapezoidal wave based on said trigger pulse, first phase comparator means for comparing the phase of said trapezoidal wave from said trapezoidal wave generating means and the phase of said reference pulse, second phase comparator means for comparing the phase of said trapezoidal wave from said trapezoidal wave generating means and the phase of said pseudo-reference pulse, and trapezoidal wave controlling means for detecting a difference between outputs of said first and second phase comparator means for controlling the gradient of the trapezoidal wave generated by said trapezoidal wave generating means depending on the detected difference, said clock pulse generating means being controlled based on the results of phase comparison between said first and second phase comparator means so that outputs of the thus controlled clock pulse generating means are used as said synchronizing clock signals.

In the synchronizing clock generator of the present invention, the gradient of the trapezoidal wave is controlled depending on the difference between an output of phase comparison between the trapezoidal wave and the reference pulse and an output of phase comparison between the trapezoidal wave and the pseudo-reference pulse, and clock pulse generating means is controlled on the basis of the results of phase comparison between the gradient-controlled trapezoidal wave and the reference pulse so that the clock pulse controlled in this manner is used as the synchronizing clock signal.

DESCRIPTION OF THE PREFERRED EMBODIMENT

Figure 1:
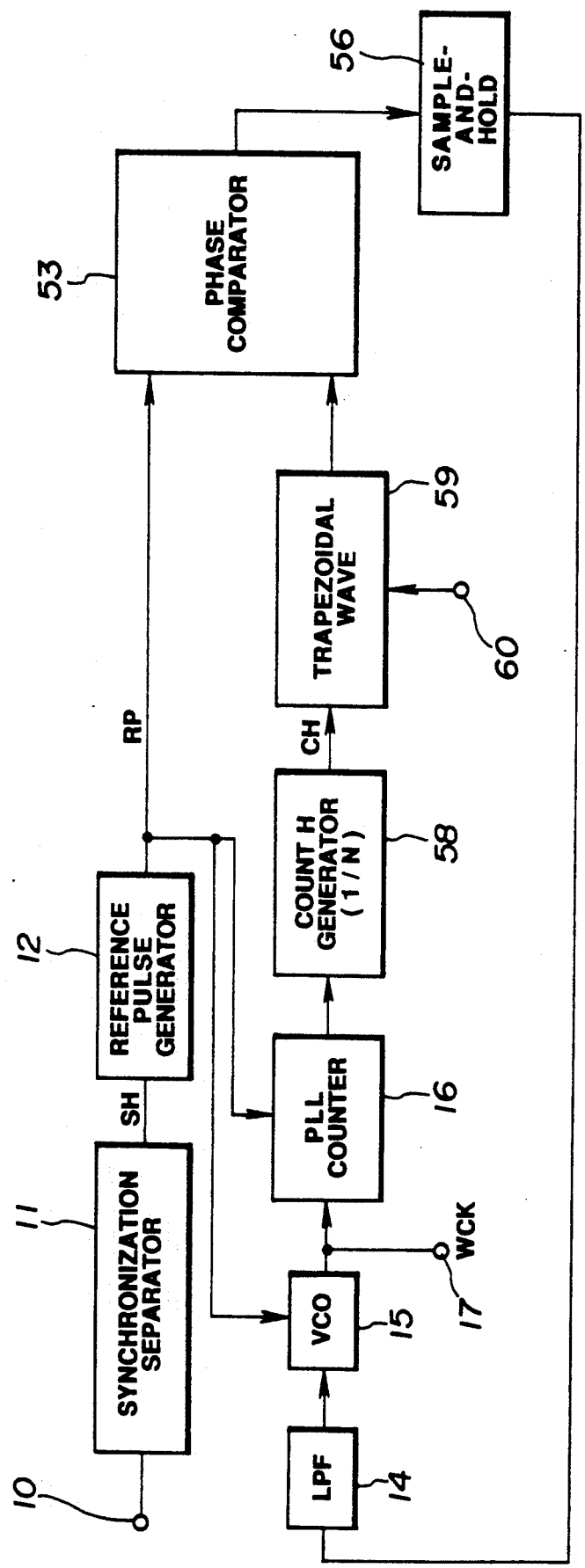
FIG. 1 is a block circuit diagram showing a schematic arrangement of a conventional synchronizing clock generating circuit.
Figure 2:
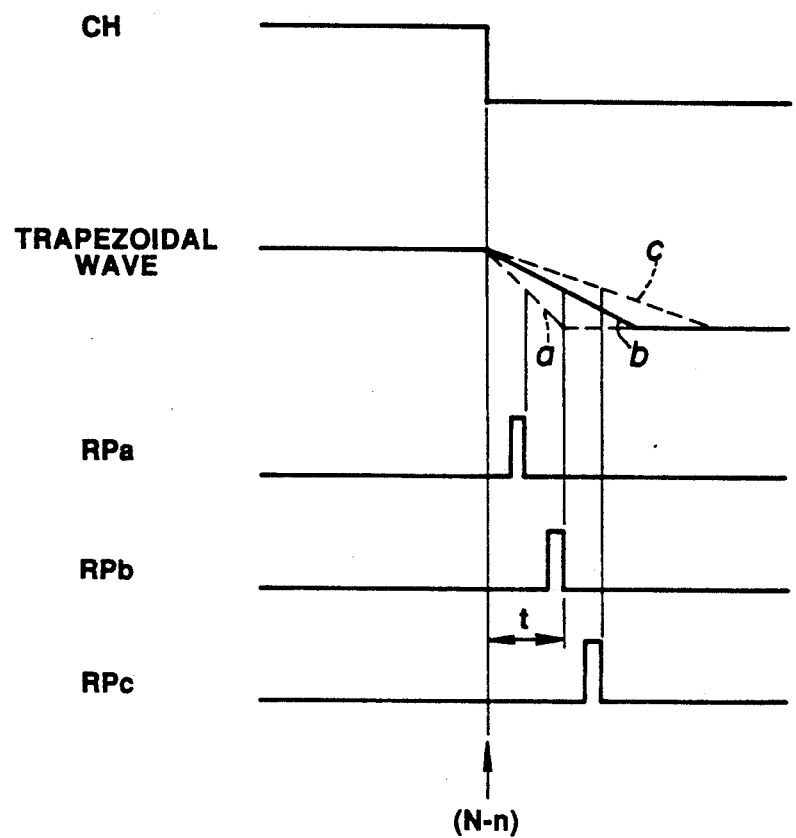
FIG. 2 is a waveform diagram for illustrating frequency deviations in the conventional synchronizing clock generating circuit.

Referring to the drawings, an embodiment of the synchronizing clock generating circuit according to the present invention is explained.

Figure 3:
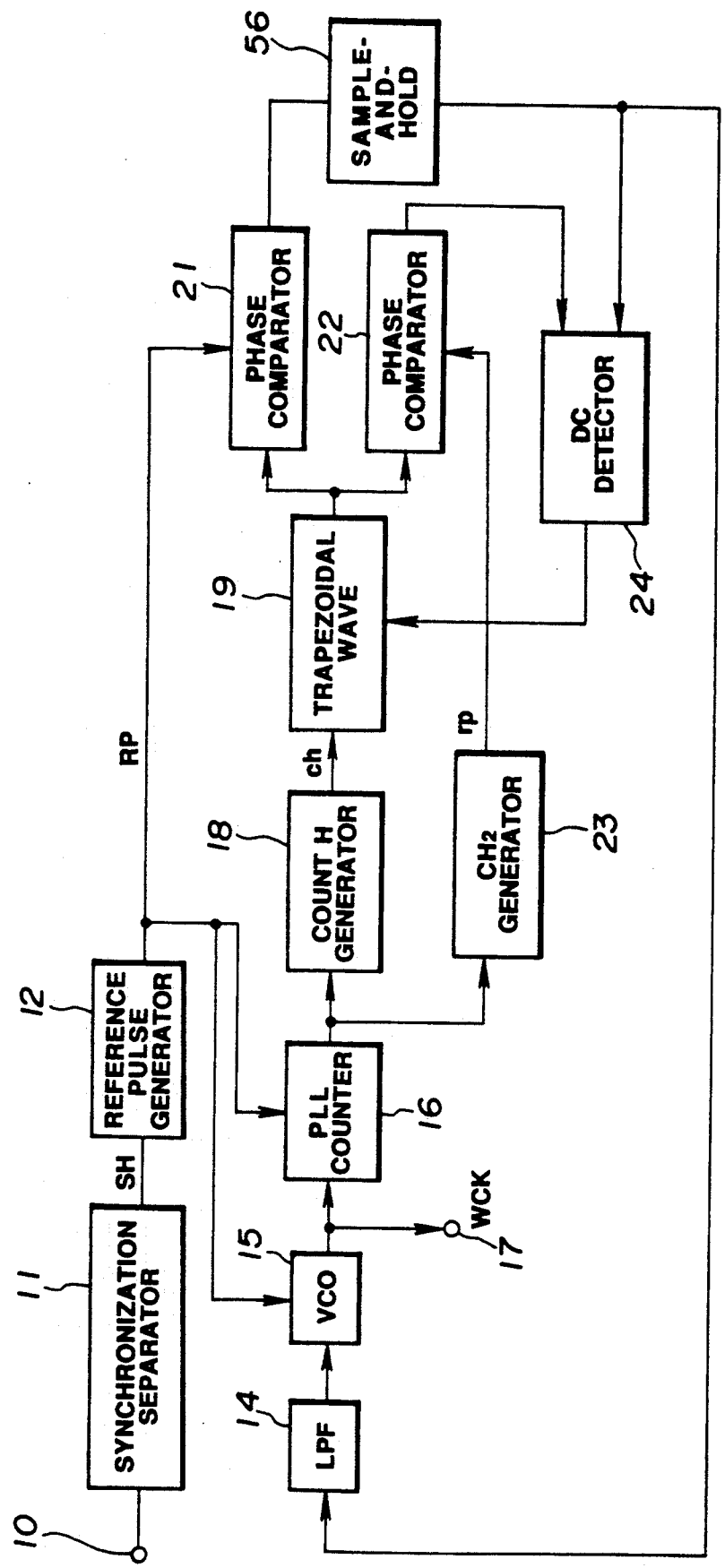
FIG. 3 is a block circuit diagram showing a schematic arrangement of a synchronizing clock generating circuit according to the present invention.

FIG. 3 shows, in a block circuit diagram, a synchronizing pulse generating circuit according to the present invention.

The synchronizing pulse generating circuit of the present invention is adapted for generating synchronizing clock signals timed to the synchronizing signals contained in video signals supplied via input terminal 10 and for outputting the synchronizing clock signals at terminal 17 as write clock signals WCK for writing in the above-mentioned TBC memory.

The circuit shown in FIG. 3 includes a reference pulse generator 12 for generating reference pulses RP depending on synchronizing signals contained in the input video signals, a VCO 15 as a clock pulse generator for generating synchronizing clock signals as clock signals, a PLL counter 16 as counting means for counting the above-mentioned synchronizing clock signals on the basis of the above-mentioned reference pulses, a CH2 generator 23 as a pseudo-reference pulse generator for generating pseudo-reference pulses rp based on an count output of the PLL counter 16, a count H generator 18 as a trigger pulse generating means for generating a trigger pulse CH on the basis of the count output of the PLL counter 16, a trapezoidal wave generator 19 for generating a trapezoidal wave based on the above-mentioned trigger pulse, a first phase comparator 21 for effecting phase comparison between the trapezoidal wave from the trapezoidal wave generator 19 and the reference pulse RP, a second phase comparator for effecting phase comparison between the trapezoidal wave from the trapezoidal wave generator 19 and the pseudo-reference pulse rp, and a DC detection circuit 24 for detecting the difference in the outputs from the first phase comparator 21 and the second phase comparator 22 for controlling the gradient of the trapezoidal wave generated by the generator 19 on the basis of the detected difference in the phase comparator outputs. The VCO 15 is controlled on the basis of the results of phase comparison in the first phase comparator 21 so that an output of the controlled VCO 15 is used as the above-mentioned write clock signal WCK.

Meanwhile, the parts or components having the similar function to that of those of FIG. 3 are designated by the same reference numerals and the detailed description is omitted for simplicity.

In the above-mentioned conventional synchronizing clock generating circuit, the gradient of the trapezoidal wave is corrected in an open loop using only the reproduced speed information supplied from the terminal 60 shown in FIG. 1, thus causing the above-mentioned inconveniences. According to the present invention, deviations in the gradient of the trapezoidal wave are detected in a manner described hereinafter without employing the above-mentioned reproduced speed information, and are fed back to the above-mentioned trapezoidal wave generator 19 for controlling the gradient of the trapezoidal wave.

Referring to FIG. 3, showing the present synchronizing clock generating circuit, horizontal synchronizing signals SH are separated in the synchronizing signal separating circuit 11 from the reproduced video signals, and reference pulses (reset pulses or sampling pulses) are generated in a reference pulse generating circuit 12 based on these horizontal synchronizing signals SH. These reference pulses RP are sent to a voltage controlled oscillator (VCO) 15 where the above-mentioned write clock signals (synchronizing clock signals) WCK are generated. A phase locked loop (PLL) counter 16 counts the number of the write clock signals WCK to transmit the result of counting to a count H generating circuit 18 which then generates pulses having, for example, a frequency equal to twice the frequency of the trigger pulses CH (double-frequency trigger pulses ch) based on the count output of the PLL counter 16. That is, the count H generating circuit 18 generates the double-frequency trigger pulses ch, having the frequency twice that of the trigger pulses CH, as shown in FIG. 4.

Figure 4:
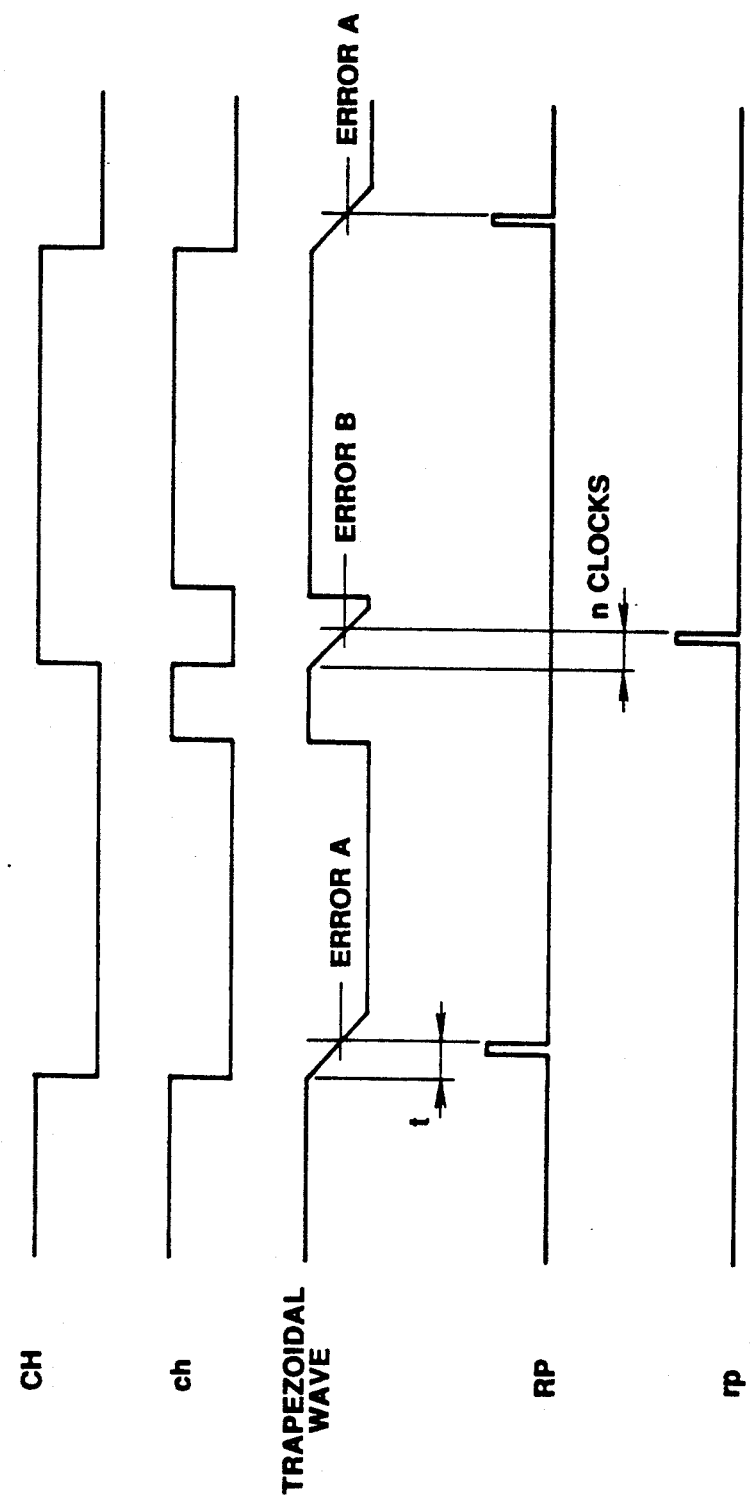
FIG. 4 is a timing chart showing signal timing of signals in a synchronizing clock generating circuit of the present invention.

These double-frequency trigger pulses ch are sent to a trapezoidal wave generator 19 which then generates a trapezoidal wave shown in FIG. 4 from the falling edge of the double-frequency trigger pulses ch. By using the double-frequency trigger pulses ch, having the frequency twice that of the trigger pulses CH, the falling edge is produced at the mid position of a horizontal period H, so that a trapezoidal wave is also produced by the trapezoidal wave generator 19 at this falling edge. This trapezoidal wave is transmitted to phase comparators 21, 22. Of these, the phase comparator 21 is supplied with the reference pulse RP from the reference pulse generator 12. Similarly to the above-mentioned phase comparator 53, the phase comparator 21 samples the trapezoidal wave from the generator 19 with the reference pulses (sampling pulses) shown in FIG. 4.

The phase comparator 22 is supplied with an output from a CH2 generator 23. The CH2 generator 23 generates, on the basis of a count output of the PLL counter 16, a pseudo-reference pulse rp at a position equal to n clocks as counted from the falling edge of the double-frequency trigger pulse ch, which is at the mid point of the horizontal period H, as shown in FIG. 4. Specifically, the CH2 generator 23 is adapted for generating the pseudo-reference pulse rp at the position corresponding to n clocks, in terms of the decode value of the PLL counter 16, as counted from the falling edge of the double-frequency trigger pulse ch which is at the mid point of the horizontal period H. Thus the phase comparator 22 samples the trapezoidal wave with the pseudo-reference pulses rp.

It is noted that deviation in the gradient of the trapezoidal wave from the trapezoidal wave generator 19 means that the time period corresponding to the time period t shown in FIG. 4 does not correspond to the n clocks.

Figure 5:
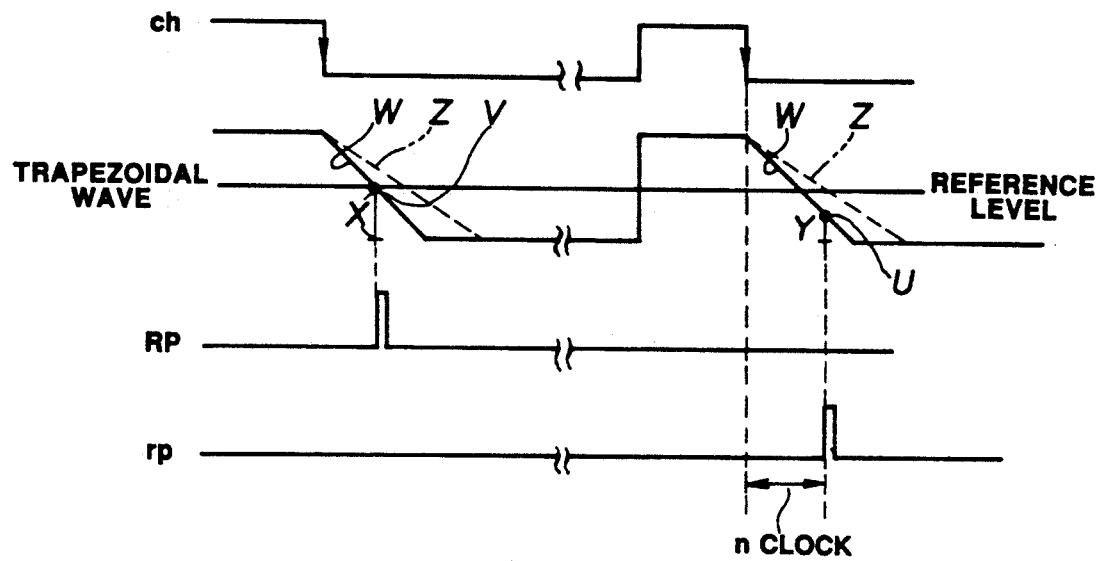
FIGS. 5 and 6 are timing charts for illustrating the controlling state of a trapezoidal wave generator of a synchronizing clock generator according to the present invention.

Thus, in the present embodiment, the sampling value obtained by sampling the trapezoidal wave with the pseudo-reference pulses rp by the phase comparator 22, expressed by a dc value, is compared to the sampling value obtained by sampling the trapezoidal wave with the reference pulse RP by the phase comparator 21, expressed by a dc value, by a DC detection circuit 24, for detecting deviation in the gradients of the trapezoidal wave. That is, the DC detection circuit 24 detects a difference between an error signal A from the phase comparator 21, expressed by a dc value, and an error signal B from the phase comparator 22, similarly expressed by a dc value, to control the trapezoidal wave generator 19 so that the difference will be reduced to zero. If, for example, the gradient of the trapezoidal wave becomes steeper than a normal slope Z, as indicated at W in FIG. 5, the phase comparator 22 generates error signals so that the VCO 15 will cope with the situation by lowering the clock frequency so that the reference pulse RP is at a position V which is at the reference level, as in the prior-art example described above. The sampling value of the steep trapezoidal wave W by the reference pulse RP is X.

In the phase comparator 22, the pseudo reference pulse rp generated by the CH2 generator 23 at a position counted n clocks, n being, for example, 14, from the falling position of the double-frequency trigger pulse ch is compared to the trapezoidal wave. In distinction from the reference pulse RP, this pseudo reference pulse rp is not controlled for sampling the trapezoidal wave at the reference level position V, but is simply generated at a position counted n clocks from the falling position of the double-frequency trigger pulse ch, so that the pseudo reference pulse rp is produced at a position U even although the trapezoidal wave has an acute slope W.

By sampling the descending slope of the trapezoidal wave W with this pseudo reference pulse rp, a sampling value Y is produced which is lower than the sampling value X by the reference pulse RP.

Figure 6:
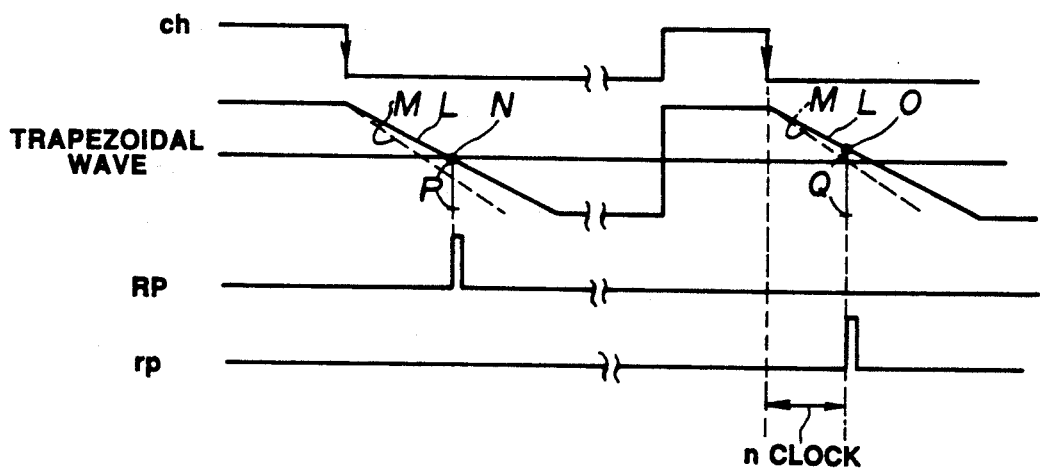

When the gradient of the trapezoidal wave is milder as at L than the normal gradient M as shown in FIG. 6, the reference pulse RP samples the trapezoidal wave at the phase comparator 21 at a position N which is the reference level to produce a sampling value P, while the pseudo reference pulse rp samples the trapezoidal wave at the phase comparator 22 at a position O counted n clocks from the double frequency trigger pulse ch to produce a sampling value Q. These sampling values X, Y and P, Q are compared at DC detector 24 and the trapezoidal wave generator 19 is controlled for reducing the difference to zero for bringing the descending gradient of the trapezoidal wave to a normal gradient shown at Z in FIG. 5 or M in FIG. 6.

Since these changes in the trapezoidal wave are those having long time constants, such as changes in temperature characteristics or with lapse of time, it is unnecessary for the trapezoidal wave control system to be so highly responsive as the PLL system. For this reason, the dc components of the sampling values X, Y or P, Q are compared to each other in the dc detector 24 for producing control signals to be supplied to the trapezoidal wave generator 19.

The error signals A from the phase comparator 21 is supplied to the lowpass filter 14 via the sample-and-hold circuit 56. Thus the VCO 15 is controlled based on the error signals A supplied via the lowpass filter 14 so that the synchronizing clock signals corrected for errors may be outputted from VCO 15. In this manner, the write clock signals WCK supplied to the TBC memory may also be corrected for errors.

It will be seen from above that the present invention provides a synchronizing clock generating circuit of the present invention in which the trapezoidal wave and the reference pulse RP are compared to each other as to phase by the phase comparator 21, while the trapezoidal wave and the pseudo-reference pulse rp are also compared to each other as to phase by the phase comparator 22, and the difference between the results of comparison by these phase comparators is detected by the dc detection circuit. The trapezoidal wave generator 19 is controlled so that the difference will be reduced to zero, and an output of clock pulse generating means controlled by the results of phase comparison is used as a synchronizing clock signal. In this manner, the synchronizing clock signals may be stabilized in frequency. Besides, the synchronizing clock signals remain unaffected by changes in the reproducing speed, in a manner different from the conventional open-loop gradient controlling system employing the reproducing speed information. Frequency deviations caused by temperature characteristics or changes with lapse of time may also be corrected, so that the synchronizing clock signals, that is write clock signals for the TBC memory, may be stabilized in frequency to prevent deteriorations in the reproduced pictures, such as bends or distortions, for improving the picture quality. In addition, since the trapezoidal wave may be corrected by a feedback loop, it is unnecessary to effect initial adjustment of the trapezoidal wave or to dispense with adjustment, as well as to reduce production costs.

What is claimed is:

1. A clock signal generator:
   reference pulse generating means for generating reference pulses in response to synchronizing signals contained in an input video signal,
   clock signal generating means for generating a clock signal having clock pulses in response to said reference pulses and a first error signal,
   counting means for counting said clock pulses to produce a count output,
   pseudo-reference pulse generating means for generating pseudo-reference pulses in response to said count output,
   trigger pulse generating means for generating trigger pulses in response to said count output,
   trapezoidal wave generating means for generating trapezoidal waves in response to said trigger pulses and a trapezoidal wave controlling signal,
   first phase comparator means for sampling said trapezoidal waves in response to said reference pulses to produce said first error signal,
   second phase comparator means for sampling said trapezoidal waves in response to said pseudo-reference pulses to produce a second error signal, and
   trapezoidal wave controlling means for detecting a difference between said first and second error signals and for producing said trapezoidal wave controlling signal based on said difference.

2. A clock signal generator as in claim 1, wherein said trapezoidal wave generating means generates two trapezoidal waves for each of said reference pulses, said first phase comparator means samples one of said two trapezoidal waves and said second phase comparator means samples the other of said two trapezoidal waves.

3. A clock signal generator as in claim 2, further comprising holding means for holding said first error signal and supplying said first error signal as a delayed first error signal to said trapezoidal wave controlling means and to said clock pulse generating means.

4. A clock signal generator as in claim 1, wherein the time constant of said trapezoidal wave controlling means is longer than the time constant of said clock pulse generating means.

* * * * *